United States Patent [19]

Price, Jr.

[11] Patent Number: 4,749,883

[45] Date of Patent: Jun. 7, 1988

[54] CIRCUIT HAVING AN OUTPUT REFERENCED TO A SPECIFIC VOLTAGE IN RESPONSE TO EITHER AN ECL OR TTL INPUT

[75] Inventor: John J. Price, Jr., Mesa, Ariz.

[73] Assignee: Motorola, Inc., Schaumburg, Ill.

[21] Appl. No.: 33,959

[22] Filed: Apr. 3, 1987

[51] Int. Cl.$^4$ .................. H03K 5/01; H03K 19/092
[52] U.S. Cl. .................................. 307/264; 307/475
[58] Field of Search .................. 307/264, 318, 475

[56] References Cited

U.S. PATENT DOCUMENTS

| | | | |
|---|---|---|---|
| 3,974,402 | 8/1976 | Fett et al. | 307/475 |
| 4,339,673 | 7/1982 | Perry | 307/475 |
| 4,527,079 | 7/1985 | Thompson | 307/475 |
| 4,647,799 | 3/1987 | Hsu et al. | 307/264 |

Primary Examiner—John Zazworsky
Attorney, Agent, or Firm—William E. Koch

[57] ABSTRACT

A translation circuit provides an output referenced to ground in response to either an ECL input or a TTL input. ECL or TTL supply voltages are selectively applied to first, second, third and fourth supply voltage terminals in accordance with the type of input signal received.

16 Claims, 1 Drawing Sheet

CIRCUIT HAVING AN OUTPUT REFERENCED TO A SPECIFIC VOLTAGE IN RESPONSE TO EITHER AN ECL OR TTL INPUT

FIELD OF THE INVENTION

This invention relates in general to a translation circuit that may be operated with either a single supply voltage or dual supply voltages for providing an output signal referenced to a specific voltage regardless of an input signal voltage reference and more particularly to circuitry within a system such as a video digital-to-analog converter for driving high-resolution monitors, wherein either single or dual supply voltages may be selectively applied to the system for receiving ECL and/or TTL inputs.

BACKGROUND OF THE INVENTION

Integrated circuits fabricated with bipolar technology may comprise a PNP transistor coupled to a +5.0 volts supply for providing an output signal referenced to ground. However, for special purpose circuits such as video digital-to-analog converters driving high resolution monitors, monolithic fabrication technology has generally not provided an adequately fast PNP transistor; therefore, these DACs typically comprise NPN output current sinks coupled to a resistor referenced to the positive supply. In order to interface properly with specific systems, such as a video monitor, it is desired to place the positive supply at ground potential. If the input signals are standard ECL, then a single supply circuit will suffice. However, where TTL inputs or above ground ECL inputs are encountered, having the positive supply at ground will be less than desirable.

The variety of supply options and logic thresholds could be covered by a variety of devices, each one fitting a particular application. However, it would be more desirable to have as many options as practical in a single device.

Thus, what is needed is a translation circuit that selectably operates on either a single supply voltage or dual supply voltages for providing an output signal referenced to a specific voltage regardless of an input signal voltage reference.

SUMMARY OF THE INVENTION

Accordingly, it is an object of the present invention to provide an improved translation circuit for providing an output signal referenced to a specific voltage regardless of an input signal voltage reference.

Another object of the present invention is to provide a circuit wherein either single or dual supply voltages may be selectively applied to the system for receiving ECL or TTL inputs and providing an output referenced to ground.

In carrying out the above and other objects of the invention in one form, there is provided a circuit comprising a first, second, third and fourth supply voltage terminals. An output circuit is coupled between the third and fourth supply voltage terminals and is coupled to an output terminal for providing an output signal at the output terminal. A translation circuit is coupled between the first, second and fourth supply voltage terminals and is coupled to the input terminal and the output circuit for biasing the output circuit in order to provide an output at the output terminal that is referenced to a second supply voltage when one of a first or a second condition occur, said first condition being when a first supply voltage is applied to the first and third supply voltage terminals and a second supply voltage is applied to the second and fourth supply voltage terminals and the input signal is referenced below the third supply voltage terminal (most positive supply voltage, which may or may not be ground), the second condition being when the first supply voltage is applied to the first supply voltage terminal, the second supply voltage is applied to the second and third supply voltage terminals, and a third supply voltage is applied to the fourth supply voltage terminal and the input signal is referenced above said third voltage terminal (typically ground), the first, second and third supply voltages being successively smaller in value.

The above and other objects, features, and advantages of the present invention will be better understood from the following detailed description taken in conjunction with the accompanying drawings.

DETAILED DESCRIPTION OF THE INVENTION

Figure 1:
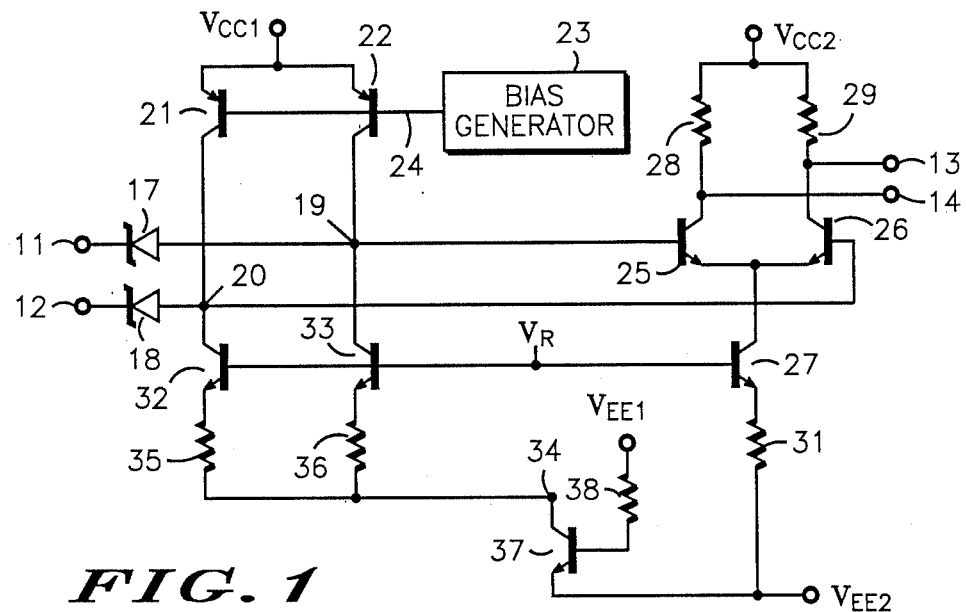
FIG. 1 is a partial schematic of the present invention.

Referring to FIG. 1, the translator circuit comprises supply voltage terminals $V_{CC1}$, $V_{CC2}$, $V_{EE1}$ and $V_{EE2}$, input terminals 11 and 12, and output terminals 13 and 14. Diodes 17 and 18 are coupled between input terminals 11, 12 and nodes 19, 20, respectively, for transferring the proper voltage level of input signals applied to input terminals 11 and 12 to nodes 19 and 20.

Transistors 21 and 22 have their emitters connected to supply voltage $V_{CC1}$, their collectors connected to nodes 20 and 19, respectively, and their bases connected to bias generator 23 by connector 24. Differentially connected NPN transistors 25 and 26 have their emitters connected to the collector of current source transistor 27, their bases connected to nodes 19 and 20, respectively, and their collectors both coupled to supply voltage $V_{CC2}$ by resistors 28 and 29, respectively, and to output terminals 13 and 14, respectively, for translating the signals on nodes 19 and 20 to output terminals 13 and 14. Current source transistor 27 has a base connected to voltage reference $V_R$ and an emitter coupled to supply voltage $V_{EE2}$ by resistor 31. Current source transistors 32 and 33 have their collectors connected to nodes 20 and 19, respectively, their bases connected to receive voltage reference $V_R$, and their emitters coupled to node 34 by resistors 35 and 36, respectively. Transistor 37 has a collector connected to node 34, an emitter connected to supply voltage $V_{EE2}$, and a base coupled to supply voltage $V_{EE1}$ by resistor 38.

The translator circuit of FIG. 1 may be operated with either a single supply voltage or a dual supply voltage in order to provide an output signal referenced to a specific voltage regardless of an input signal voltage reference. For the single supply option, $V_{CC1}$ and $V_{CC2}$ are tied together and $V_{EE1}$ and $V_{EE2}$ are tied together. $V_{CC1}$ and $V_{CC2}$ are connected to +5.0 volts or ground, and $V_{EE1}$ and $V_{EE2}$ are connected to ground or −5.0 volts, respectively. When the supply voltages are applied in this single supply option, transistors 21 and 22 are turned on for reasons to be discussed hereinafter relating to FIG. 2. Since $V_{EE1}$ is at the same potential as $V_{EE2}$, transistor 37 is off, causing transistors 32 and 33 to be biased off. Therefore, diodes 17 and 18 are biased on, transmitting the input signals on input terminals 11 and 12, shifted up by one diode drop, to nodes 19 and 20.

For the dual supply option, $V_{CC1}$ and $V_{EE1}$ are connected to +5.0 volts and ground, respectively, and $V_{CC2}$ and $V_{EE2}$ are connected to ground and −5.0 volts, respectively. When the supply voltages are applied in this manner, transistors 21 and 22 are turned off for reasons to be discussed hereinafter relating to FIG. 2. Since $V_{EE1}$ is at a higher potential than $V_{EE2}$, transistor 37 will be biased on, causing transistors 35 and 36 to be biased on. Therefore, diodes 17 and 18 become zener diodes which shift the input signals below ground to interface with the differentially connected transistors 25 and 26.

Figure 2:
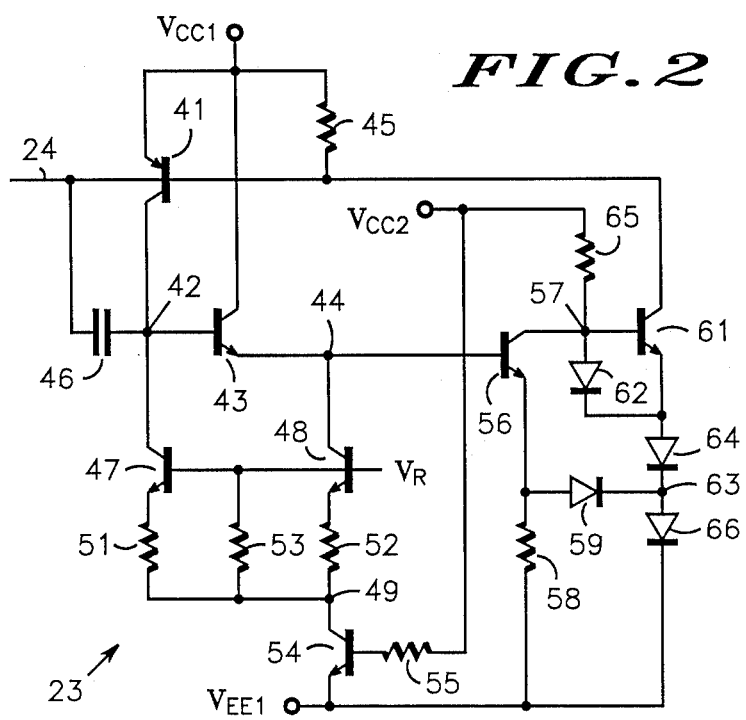
FIG. 2 is a schematic of a bias generator for the circuit of FIG. 1.

Referring to FIG. 2, bias generator 23 comprises PNP transistor 41 having an emitter connected to supply voltage $V_{CC1}$, a base connected to connector 24, and a collector connected to node 42. Transistor 43 has a collector connected to supply voltage $V_{CC1}$, a base connected to node 42, and an emitter connected to node 44. Connector 24 is coupled to supply voltage $V_{CC1}$ by resistor 45 and to node 42 by capacitor 46. Transistors 47 and 48 have their collectors connected to nodes 42 and 44, respectively, their emitters coupled to node 49 by resistors 51 and 52, respectively, and their bases coupled both to node 49 by resistor 53 and for receiving reference voltage $V_R$. Transistor 54 has a collector connected to node 49, an emitter connected to $V_{EE1}$, and a base coupled to supply voltage $V_{CC2}$ by resistor 55. Transistor 56 has a collector connected to node 57, a base connected to node 44 and an emitter both coupled to $V_{EE1}$ by resistor 58 and connected to the anode of diode 59. Transistor 61 has a collector connected to connector 24, a base connected to node 57, and an emitter coupled both to node 57 by diode 62 and to node 63 by diode 64. Node 57 is coupled to supply voltage $V_{CC2}$ by resistor 65. Node 63 is connected to the cathode of diode 59 and is coupled to $V_{EE1}$ by diode 66.

When $V_{CC1}$ and $V_{CC2}$ both have the same voltage level (single voltage supply option) and are 5.0 volts higher than $V_{EE1}$, transistor 61 will be on, pulling conductor 24 low, turning on transistors 21 and 22. The feedback path comprising transistors 43 and 56 insure that transistor 61 is appropriately biased to force transistor 41 to source the same magnitude of current that reference transistor 47 sinks. Transistors 21 and 22 are designed to match transistor 41 so their respective collector currents also source the same value of current. When $V_{CC1}$ is 5.0 volts higher than $V_{CC2}$, and $V_{CC2}$ and $V_{EE1}$ both have the same voltage level (dual voltage supply option), transistors 47, 54 and 61 will be off, causing conductor 24 to go high, turning off transistors 21 and 22.

By now it should be appreciated that there has been provided circuitry within a system such as a video digital-to-analog converter for driving high-resolution monitors, wherein either single or dual supply voltages may be selectively applied to the system for receiving ECL or TTL inputs and providing an output referenced to ground.

I claim:
1. A circuit comprising;
an input terminal;
an output terminal;
a first supply voltage terminal;
a second supply voltage terminal;
a third supply voltage terminal;
a fourth supply voltage terminal;
first means coupled between said third and fourth supply voltage terminals and coupled to said output terminal for providing an output signal at said output terminal; and
second means coupled between said first, second and fourth supply voltage terminals and coupled to said input terminal and said first means for biasing said first means in order to provide an output at said output terminal that is referenced to a second supply voltage when one of a first or a second condition occur, said first condition being when a first supply voltage is applied to said first and third supply voltage terminals and said second supply voltage is applied to said second and fourth supply voltage terminals and an input signal is referenced below said first supply voltage, said second condition being when said first supply voltage is applied to said first supply voltage terminal, said second supply voltage is applied to said second and third supply voltage terminals, and a third supply voltage is applied to said fourth supply voltage terminal and said input signal is referenced above said second supply voltage, said first, second and third supply voltages being successively smaller in value.

2. The circuit according to claim 1 wherein said second means comprises:
third means coupled between said input terminal and a node for shifting the voltage level of said input signal;
fourth means coupled between said first supply voltage terminal and said node for selectively applying said first supply voltage to said node;
fifth means coupled between said node and said second supply voltage terminal for selectively sinking a current from said node; and
sixth means coupled between said first, second and third supply voltage terminals and to said fourth means for biasing said fourth means.

3. The circuit according to claim 2 wherein said sixth means comprises:
seventh means coupled between said second supply voltage terminal and both said first and third supply voltage terminal and to said fourth means for biasing said fourth means; and
eighth means coupled between said seventh means and said second supply voltage terminal and to said third supply voltage terminal for selectively sinking current from said seventh means.

4. The circuit according to claim 2 wherein said fourth means comprises a first transistor having its collector-emitter path coupled between said first supply voltage terminal and said node.

5. The circuit according to claim 4 wherein said fifth means comprises a second transistor having its collector-emitter path coupled between said node and said fourth supply voltage terminal, and a base coupled to said second supply voltage terminal.

6. The circuit according to claim 4 wherein said fifth means comprises:
a second transistor having its emitter coupled to said fourth supply voltage terminal and a base coupled to said second supply voltage terminal; and
a third transistor having its collector-emitter path coupled between said node and a collector of said second transistor, and a base coupled to a voltage reference.

7. The circuit according to claim 6 wherein said first means comprises:
- a first resistor;
- a fourth transistor having a collector coupled to said third supply voltage terminal by said first resistor and to said output terminal; and
- a fifth transistor having its collector-emitter path coupled between an emitter of said fourth transistor and said fourth supply voltage terminal, and a base coupled to said base of said third transistor.

8. The circuit according to claim 7 wherein said sixth means comprises:
- a second resistor;
- a third resistor;
- a sixth transistor having its collector-emitter path coupled between said fourth means and said second supply voltage terminal and a base coupled by said second resistor to said third supply voltage terminal;
- a seventh transistor having its collector-emitter path coupled between said base of said sixth transistor and said second supply voltage terminal;
- an eighth transistor having its collector-emitter path coupled between said first supply voltage terminal and a base of said seventh transistor;
- a ninth transistor having its collector-emitter path coupled between said first supply voltage terminal and a base of said eighth transistor and a base coupled to said collector of said sixth transistor; and
- a tenth transistor having its collector-emitter path coupled between said bases of both said seventh and eighth transistors and said second supply voltage terminal, and a base coupled to said third supply voltage terminal by said third resistor.

9. A circuit comprising:
- a first supply voltage terminal for receiving a first supply voltage;
- a second supply voltage terminal for receiving a second supply voltage;
- a third supply voltage terminal for selectively receiving said first supply voltage or said second supply voltage;
- a fourth supply voltage terminal for selectively receiving said second supply voltage or a third supply voltage, said first, second and third supply voltages being successively smaller in value;
- an input terminal for receiving an input signal referenced either above said third supply voltage terminal or referenced below said third supply voltage terminal;
- an output terminal;
- first means coupled between said third and fourth supply voltage terminals and coupled to said output terminal for providing an output signal at said output terminal referenced below said second supply voltage; and
- second means coupled between said first, second and fourth supply voltage terminals and coupled to said input terminal and said first means for biasing said first means so that said first means provides said output when one of a first condition or a second condition occurs, said first condition occurring when said first and second supply voltages are applied to said third and fourth supply voltage terminals, respectively, and said input signal is referenced below said third supply voltage terminal, said second condition occurring when said second and third supply voltages are applied to said third and fourth supply voltage terminals, respectively, and said input signal is referenced above said third supply voltage terminal.

10. The circuit according to claim 9 wherein said second means comprises:
- third means coupled between said input terminal and a node for shifting the voltage level of said input signal;
- fourth means coupled between said first supply voltage terminal and said node for selectively applying said first supply voltage to said node;
- fifth means coupled between said node and said second supply voltage terminal for selectively sinking a current from said node; and
- sixth means coupled between said first, second and third supply voltage terminals and to said fourth means for biasing said fourth means.

11. The circuit according to claim 10 wherein said sixth means comprises:
- seventh means coupled between said second supply voltage terminal and both said first and third supply voltage terminal and to said fourth means for biasing said fourth means; and
- eighth means coupled between said seventh means and said second supply voltage terminal and to said third supply voltage terminal for selectively sinking current from said seventh means.

12. The circuit according to claim 10 wherein said fourth means comprises a first transistor having its base emitter path coupled between said first supply voltage terminal and said node.

13. The circuit according to claim 12 wherein said fifth means comprises a second transistor having its collector-emitter path coupled between said node and said fourth supply voltage terminal, and a base coupled to said second supply voltage terminal.

14. The circuit according to claim 12 wherein said fifth means comprises:
- a second transistor having its emitter coupled to said fourth supply voltage terminal and a base coupled to said second supply voltage terminal; and
- a third transistor having its collector-emitter path coupled between said node and a collector of said second transistor, and a base coupled to a reference voltage.

15. The circuit according to claim 14 wherein said first means comprises:
- a first resistor;
- a fourth transistor having a collector coupled to said third supply voltage terminal by said first resistor and to said output terminal; and
- a fifth transistor having its collector-emitter path coupled between an emitter of said fourth transistor and said fourth supply voltage terminal, and a base coupled to said base of said third transistor.

16. The circuit according to claim 15 wherein said sixth means comprises:
- a second resistor;
- a third resistor;
- a sixth transistor having its collector-emitter path coupled between said fourth means and said second supply voltage terminal and a base coupled by said second resistor to said third supply voltage terminal;
- a seventh transistor having its collectoremitter path coupled between said base of said sixth transistor and said second supply voltage terminal;

an eight transistor having its collector-emitter path coupled between said first supply voltage terminal and a base of said seventh transistor;

a ninth transistor having its collector-emitter path coupled between said first supply voltage terminal and a base of said eighth transistor and a base coupled to said collector of said sixth transistor; and a tenth transistor having its collector-emitter path coupled between said bases of both said seventh and eighth transistors and said second supply voltage terminal, and a base coupled to said third supply voltage terminal by said third resistor.

* * * * *